United States Patent [19]

Nippert

[11] Patent Number: 5,600,237
[45] Date of Patent: Feb. 4, 1997

[54] METHOD AND APPARATUS FOR DETERMINING THE POSITION OF AN ARMATURE IN AN ELECTROMAGNETIC ACTUATOR BY MEASURING THE DRIVING VOLTAGE FREQUENCY

[75] Inventor: Andrew H. Nippert, Washington, Ill.

[73] Assignee: Caterpillar Inc., Peoria, Ill.

[21] Appl. No.: 474,423

[22] Filed: Jun. 7, 1995

Related U.S. Application Data

[62] Division of Ser. No. 800,815, Nov. 29, 1991, Pat. No. 5,481,187.

[51] Int. Cl.$^6$ ............................. G01B 7/14; G01N 27/72; G01R 33/12
[52] U.S. Cl. ................ 324/207.16; 324/207.24; 324/236
[58] Field of Search .................. 324/207.16, 207.24, 324/236, 652, 655, 654, 234, 681, 682, 707, 708

[56] References Cited

U.S. PATENT DOCUMENTS

5,172,298  12/1992  Shimizu et al. ............... 324/207.16
5,420,507   5/1995  Laskowski ..................... 324/207.16

*Primary Examiner*—Walter E. Snow
*Attorney, Agent, or Firm*—Dave M. Masterson

[57] ABSTRACT

Electromagnetic actuators having a coil and an armature are used in a number of applications in which it is useful to have an indication of the position of the armature with respect to the coil without the use of external sensors. Accordingly, an actuator control system is provided for determining the position of the armature with respect to the coil in response to the current magnitude and frequency of current flowing in the coil.

6 Claims, 7 Drawing Sheets

Fig_1_

Fig_2_

Fig_5A

Fig_5B

Fig-6-

METHOD AND APPARATUS FOR DETERMINING THE POSITION OF AN ARMATURE IN AN ELECTROMAGNETIC ACTUATOR BY MEASURING THE DRIVING VOLTAGE FREQUENCY

This is a divisional of application Ser. No. 07/800,815, which was filed Nov. 29, 1991, now U.S. Pat. No. 5,481,187.

TECHNICAL FIELD

This invention relates generally to a method and apparatus for determining the position of the armature of an electromagnetic actuator, and more particularly, to a method and apparatus for measuring the frequency of voltage applied to the electromagnetic actuator and responsively determining the position of the armature.

BACKGROUND ART

Electromagnetic actuators, such as linear or rotary solenoids, typically include a coil in electromagnetic communication with a movable armature. The coil is generally connected to a controllable driving circuit which varies the magnitude of current flowing in the coil and resultantly varies the strength of the magnetic field being produced by the coil. As the strength of the magnetic field is changed, the armature moves in response to the resulting change in the magnetic force being exerted on the armature.

Typically, the position of the armature is a function of both the magnitude of current flowing in the coil and the magnitude and direction of mechanical forces being exerted on the armature. The mechanical forces are exerted on the armature in response to the operating conditions of the system in which the electromagnetic actuator is operating. It is therefore advantageous to have a method of determining the position of the armature so that the operating conditions of the system can be indicated and used in connection with system diagnostics or a closed-loop control for the driving circuit.

The most common method of determining the position of the armature of an electromagnetic actuator is to connect an external sensor to the actuator. Such sensors often take the form of potentiometers or linear voltage differential transformers (LVDTs). While the addition of these sensors provides the desired information, they increase the cost and warehousing requirements of the actuator.

Attempts to provide position information without utilizing additional sensors have generally taken the form described in Japanese Patent Appl. No. 61-157418, published Jan. 20, 1988, and in *Proceedings: 39th Relay Conference*, Apr. 22–24, 1991, National Association of Relay Manufacturers, pp. 9-1 through 9-4. Both of the above publications disclose systems which determine the position of the armature by measuring the inductance of the coil in the actuator. Since inductance is a function of the air gap between the armature and the coil, the size of the air gap, and hence armature position, is determined by comparing measured inductance values to empirically determined inductance versus position characteristics. Systems of this type are generally incapable of providing accurate results for actuators exhibiting second-order characteristics since such actuators do not have explicit inductance values. Furthermore, as described in the Japanese Application, additional measurements and comparisons, e.g. coil temperature and magnetomotive force, are required to provide accurate indications of armature position.

Devices for determining armature position are particularly useful in connection with solenoids and electrohydraulic valves. Electrohydraulic valves are often used to control the engagement/disengagement of transmission clutches. The engagement of a hydraulic clutch consists of two stages: the fill mode and the pressure modulation mode. In the fill mode, the displaced clutch volume is filled with hydraulic fluid. In the pressure modulation mode, the pressure within the clutch volume is modulated (increased) to a pressure level to ensure proper and full engagement of the clutch. To actuate the clutch, the solenoid is therefore, first energized to begin filling the clutch. When the clutch is filled, the current applied to the solenoid is modulated (typically, in an increasing linear ramp function) to continue the flow of hydraulic fluid to the clutch and increase the pressure to a level sufficient to properly engage the clutch.

Typically, a timing strategy has been used to determine when the clutch has reached the end of fill condition. In this situation, the solenoid's coil would be energized and the clutch would begin to fill with hydraulic fluid. After a predetermined time period, the transmission controller would begin to modulate current, in an effort to fully engage the clutch.

This procedure has several limitations. For example, operating conditions change the actual time required to fill the clutch. Since pump flow is a function of engine speed, pump flow will vary with engine speed. Other factors (for example, other hydraulic systems being supplied by the pump) may also affect pump flow. As the pump flow varies, the time required to fill the clutch will also vary. Other operating conditions which affect the clutch fill times are present gear ratio, desired gear ratio, transmission load, and inclination of the vehicle.

Variations in the engine and operating characteristics of the transmission components can be expected over the life of the vehicle due to wear. This will also affect the clutch fill time.

Furthermore, variations in the system components, including the clutches, due to manufacturing tolerances will also affect clutch fill time.

If the proper fill time is not known or accurately estimated, the clutch will be in an overfill or underfill condition when the controller attempts to modulate clutch pressure to fully engage the clutch.

Operation of the transmission by modulating the clutch pressure in an underfill or overfill condition will cause a "jerky" shift action and increase the rate at which wear and tear occurs.

In an attempt to predict fill times, sensors are often added to the transmission controller. For example, U.S. Pat. No. 4,707,789 issued to Robert C. Downs et al., on Nov. 17, 1987, uses a transmission input speed sensor to detect underfill/overfill condition. The time delay used to estimate clutch fill is adjusted based upon the transmission input speed. However, transient changes, that is, changes in the operating conditions that the controller has not adapted to, will affect the shift quality. Furthermore, a transient condition will have a negative effect on the fill time for the next shift without the transient condition.

In another attempt to accurately predict the end of fill condition, it is known to add additional valves to the controller. One such system is shown in the Komatsu technical guide, "K-ATOMICS Komatsu-Advanced Transmission with Optimum Modulation Control". A flow sensing valve is used to sense a pressure differential. The spool of the flow sensing valve closes a switch in response to the pressure differential, thereby, signalling the end of fill condition. In still another attempt, hydraulic pressure is used to predict the end of fill condition. U.S. Pat. No. 4,942,787 issued to Takashi Aoki et al., on Jul. 24, 1990, discloses the use of a pressure detection switch for that purpose. However, the cost added by the additional components in both these systems, plus, the added manufacturing cost due to the increased complexity, make these systems undesirable.

The present invention is directed at overcoming one or more of the problems as set forth above.

DISCLOSURE OF THE INVENTION

The invention avoids the disadvantages of known devices for determining the position of an armature with respect to its associated coil and provides an accurate and flexible indication of armature position with respect to the coil and end-of fill conditions in a hydraulic clutch without the need for external sensors.

In one aspect of the present invention, an apparatus is provided for determining the position of an armature of an electromagnetic actuator having a coil. A controller measures the frequency of the voltage applied to the coil and responsively determines the position of the armature with respect to the coil.

BRIEF DESCRIPTION OF THE DRAWING

For a better understanding of the present invention, reference may be made to the accompanying drawings, in which.

BEST MODE FOR CARRYING OUT THE INVENTION

Figure 1:
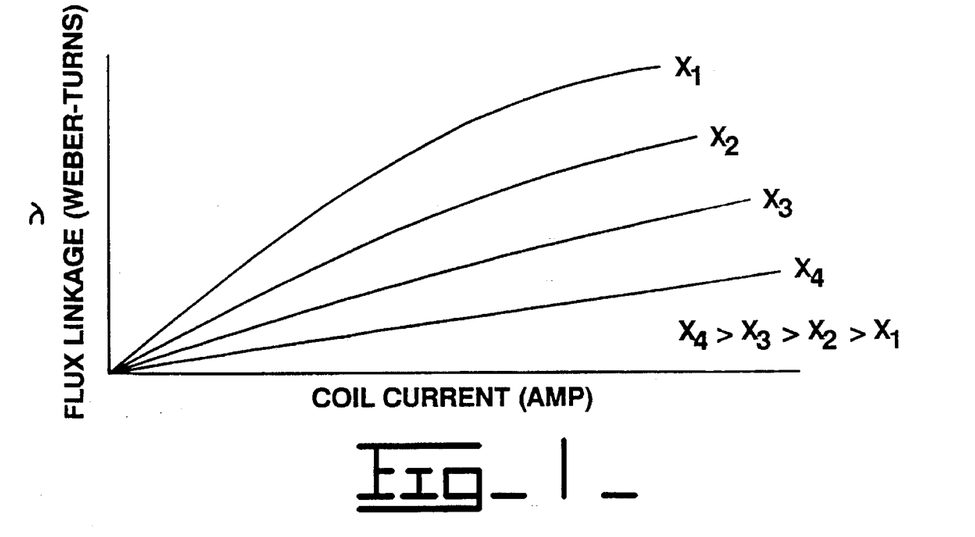
FIG. 1 is a graphical representation of the relationship between flux linkage, coil current, and armature position.

Referring to FIG. 1, flux linkage versus coil current characteristics of a generalized electromagnetic actuator are shown. The variable x represents the size of an airgap between the armature and the coil of the actuator. The size of the airgap changes as the armature moves through its range of motion. As is well-known in the art of electromagnetics, the flux linkage is a positive function of coil current and a negative function of the size of the airgap in the magnetic circuit. Thus, for a given current magnitude, the flux linkage decreases as the airgap increases. The relationship that is illustrated by the graph of FIG. 1 allows the size of the airgap, and hence the position of the armature with respect to the coil, to be determined if the flux linkage and coil current are known.

The voltage across the coil can be described by the following equation:

$$V = iR + d(Li)/dt \quad (1)$$

where i is the magnitude of current in the coil;

R is the resistance in the coil;

L is the inductance of the coil; and

Li is the flux linkage (lambda).

By dividing both sides of equation (1) by di/dt, the following equation is derived which, following manipulation, provides an expression for the slope of the characteristics illustrated in FIG. 1 as a function of coil voltage, coil current, resistance, and the rate of change of coil current.

$$d(Li)/di = (V - iR)/(di/dt) \quad (2)$$

Equation (2) indicates that since d(Li)/di is a function of armature position (see FIG. 1). Therefore, one method for determining the position of the armature is provided by storing empirically determined data representing a series of characteristics similar to those illustrated in FIG. 1, and comparing the stored data to a measured magnitude of the coil current and a calculated value for d(Li)/di. In the preferred embodiment, a two-dimensional look-up table of a type well-known in the art is used to complete the comparison and select the proper armature position value. The number of characteristics stored in memory is dependent upon the desired precision of the system. Interpolation may be used to determine the actual position of the armature in the event that the measured and calculated values fall between the discrete values stored in memory.

Figure 3:
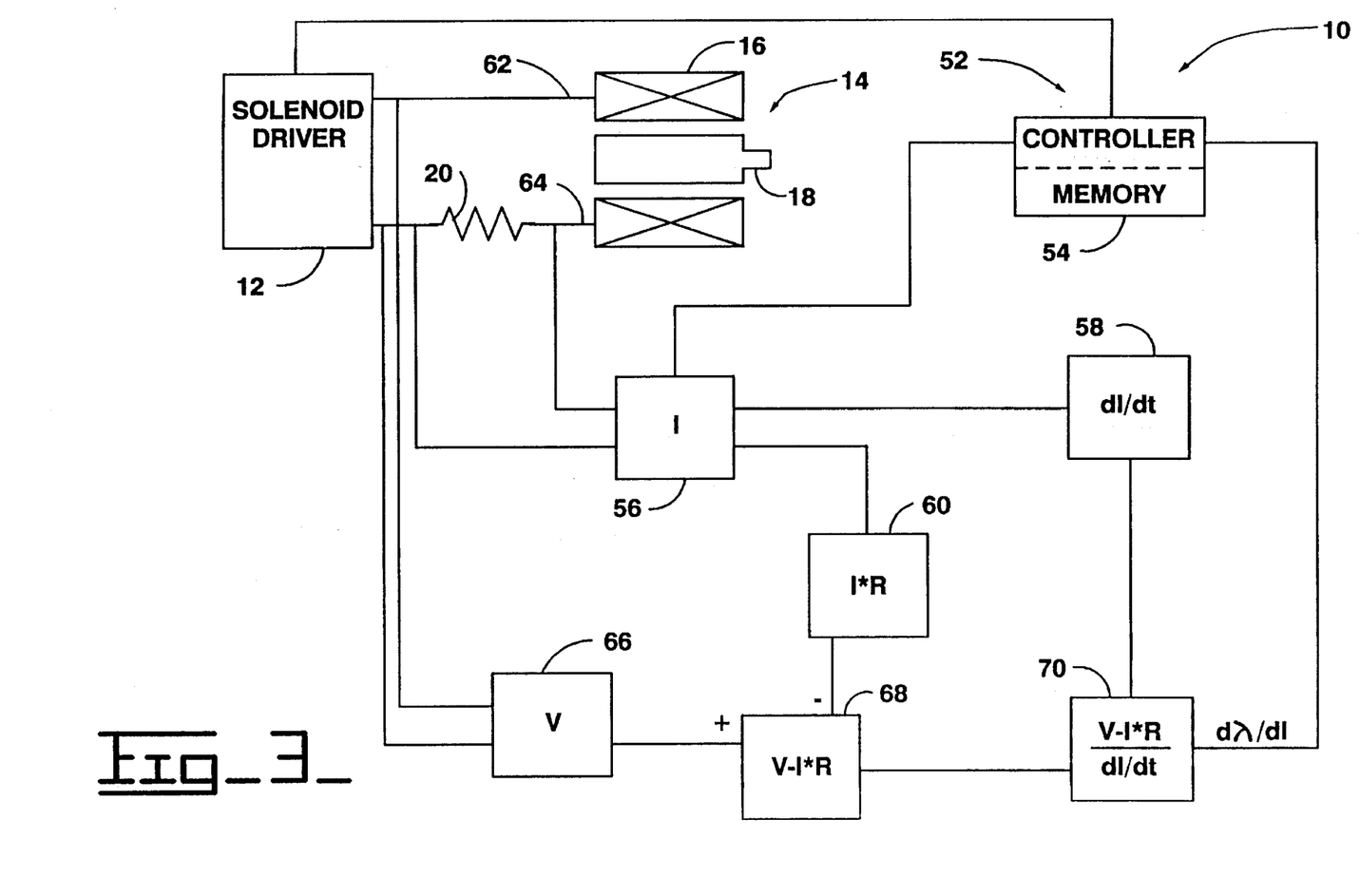
FIG. 3 is a schematic representation of an embodiment of the present invention.

Referring now to FIG. 3, an electromagnetic actuator control system 10 which determines the position of the armature in response to d(Li)/dt and coil current magnitude is diagrammatically illustrated. A solenoid driver 12 is shown in electrical connection to a solenoid 14. The solenoid 14 includes a coil 16 and an armature 18 that is movable with respect to the coil 16. In one embodiment, the armature is linearly actuatable in response to the magnitude of current flowing in the coil 16, such as a linear solenoid. In an alternative embodiment, the armature is pivotally actuatable in response to the magnitude of current flowing in the coil 16, such as a rotary solenoid. As the armature moves, the size of the airgap between the coil and the armature changes dimensions which causes the magnetic characteristics of the solenoid to change as described above.

A shunt resistor 20 is connected to and between the solenoid driver 12 and the solenoid 14. The magnitude of current flowing in the coil is determined 56 by measuring the voltage across the shunt resistor 20. The signal representing the magnitude of coil current is differentiated 58. The signal representing the magnitude of coil current is also multiplied 60 by a value representative of the internal resistance of the coil 14.

The voltage across the first and second terminals 62,64 of the coil 16 is determined 66 and a voltage signal is produced. The signal representing the current magnitude multiplied by the internal coil resistance is subtracted 66 from the voltage signal to produce a signal that is indicative of the reactive component of the voltage across the first and second terminals 62,64. The signal representing the reactive voltage component is then divided 70 by the derivative of current with respect to time in order to produce a flux linkage signal that is indicative of the derivative of flux linkage with respect to current in the coil 16.

The controller 52 includes a memory circuit 54 which has empirically determined data relating to the above-described d(Li)/dt, coil current magnitude, and armature position characteristics. The controller 52 receives the coil current magnitude signal and the flux linkage signal. The controller 52 retrieves the stored characteristics from the memory 54 and compares these characteristics to the coil current magnitude signal and flux linkage signal to determine the position of the armature 18 with respect to the coil 16. In the preferred embodiment, a two-dimensional look-up table of a type well-known in the art is used to complete the comparison and select the proper armature position value. The number of characteristics stored in memory is dependent upon the desired precision of the system. Interpolation may be used to determine the actual position of the armature in the event that the measured and calculated values fall between the discrete values stored in memory.

The controller 52 can then use this information in a diagnostic function to determine whether the solenoid 14 is operating properly, in a closed-loop control to vary the duty cycle of the PWM driving signal in response to the desired and actual positions of the armature, or in a hydraulic clutch control to indicate an end-of-fill condition.

It is to be recognized that FIG. 3 is a functional description and that a variety of different specific circuits for providing the features of the position detecting circuit could be designed by a person skilled in the art.

It should be appreciated that since it was illustrated that d(Li)/di is a function of coil current and armature position, equation (2) indicates that di/dt is likewise a function of coil current and armature position. Thus another method for determining the armature position is provided by storing a series of empirically determined characteristics representing the relationship between di/dt, coil current, and armature position in memory and comparing the stored characteristics with measured values representing the magnitude and rate of change of the coil current. As described above, interpolation may be used to determine the actual position of the armature in the event that the measured and calculated values fall between the discrete values stored in memory.

Figure 2:
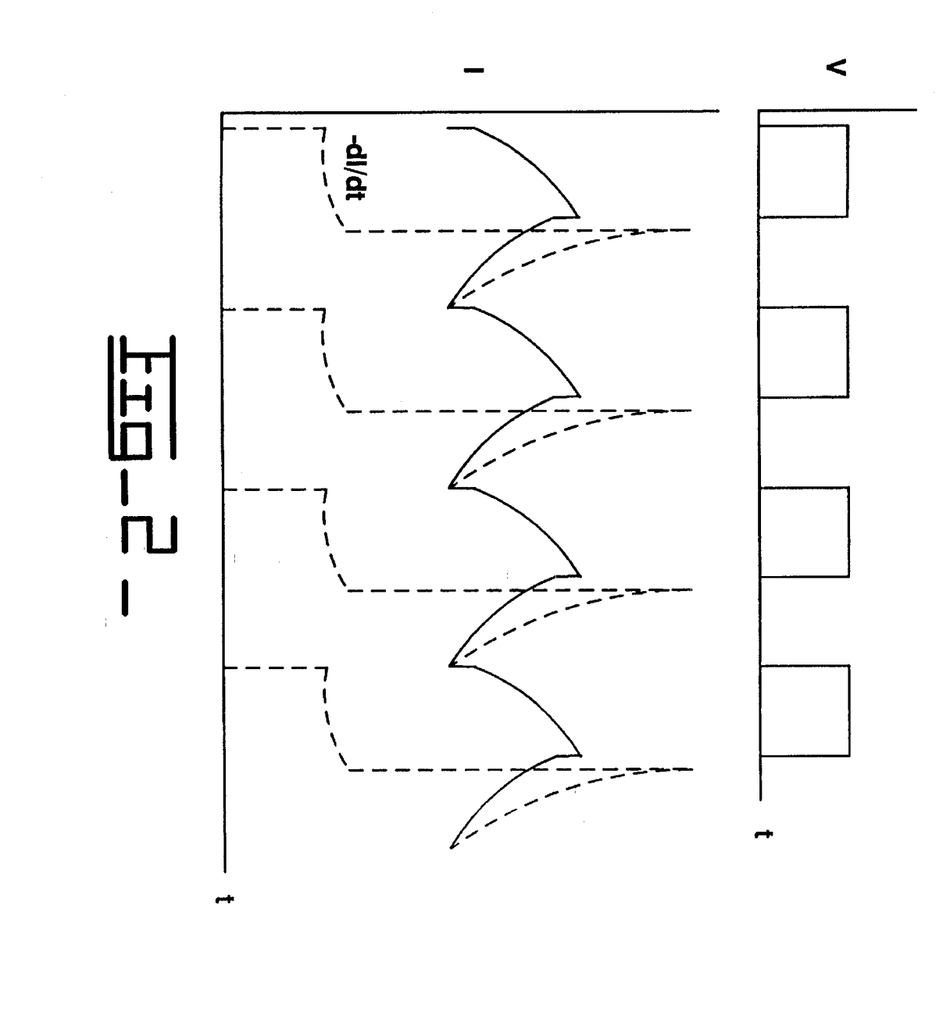
FIG. 2 is a graphical representation of the relationship between applied voltage, coil current, and the rate of change of coil current.

The relationships between the voltage of the driving signal across the terminals of the coil, the magnitude of the coil current, and–(di/dt) are shown in FIG. 2. The driving signal is advantageously a Pulse-Width Modulated (PWM) signal having a variable duty cycle. As voltage is applied to the coil, the magnitude of current in the coil exponentially increases toward a steady-state value; similarly, as voltage is removed from the coil, the magnitude of current in the coil exponentially decreases. As the duty cycle of the driving signal increases, the average magnitude of coil current increases which increases the force on the armature. Similarly, as the duty cycle of the driving signal decreases, the magnetic force impressed on the armature decreases.

It is advantageous to have a single value representative of the inductive characteristics of the coil which can be compared to the coil current magnitude and armature position information stored in memory. Since di/dt is a function of armature position and coil current magnitude, the range through which the di/dt signal varies during each cycle of the driving signal is also a function of coil current magnitude and armature position. By measuring the peak of the di/dt signal, the size of the range through which the di/dt signal varies during each cycle is indicated. The peak di/dt signal can thus be stored in memory and compared with the stored coil current magnitudes and armature positions to obtain an indication of armature position. Advantageously, the peak values of di/dt can be measured for either energization or deenergization of the coil, or both.

It is noted that the peak value of di/dt given by equation (2) ignores eddy current effects. In some cases eddy currents may substantially effect the magnitude of the peak di/dt signal. Advantageously, the instant invention is adapted to detect the peak di/dt signal even if the peak di/dt signal is dominated by eddy current effects.

Figure 4:
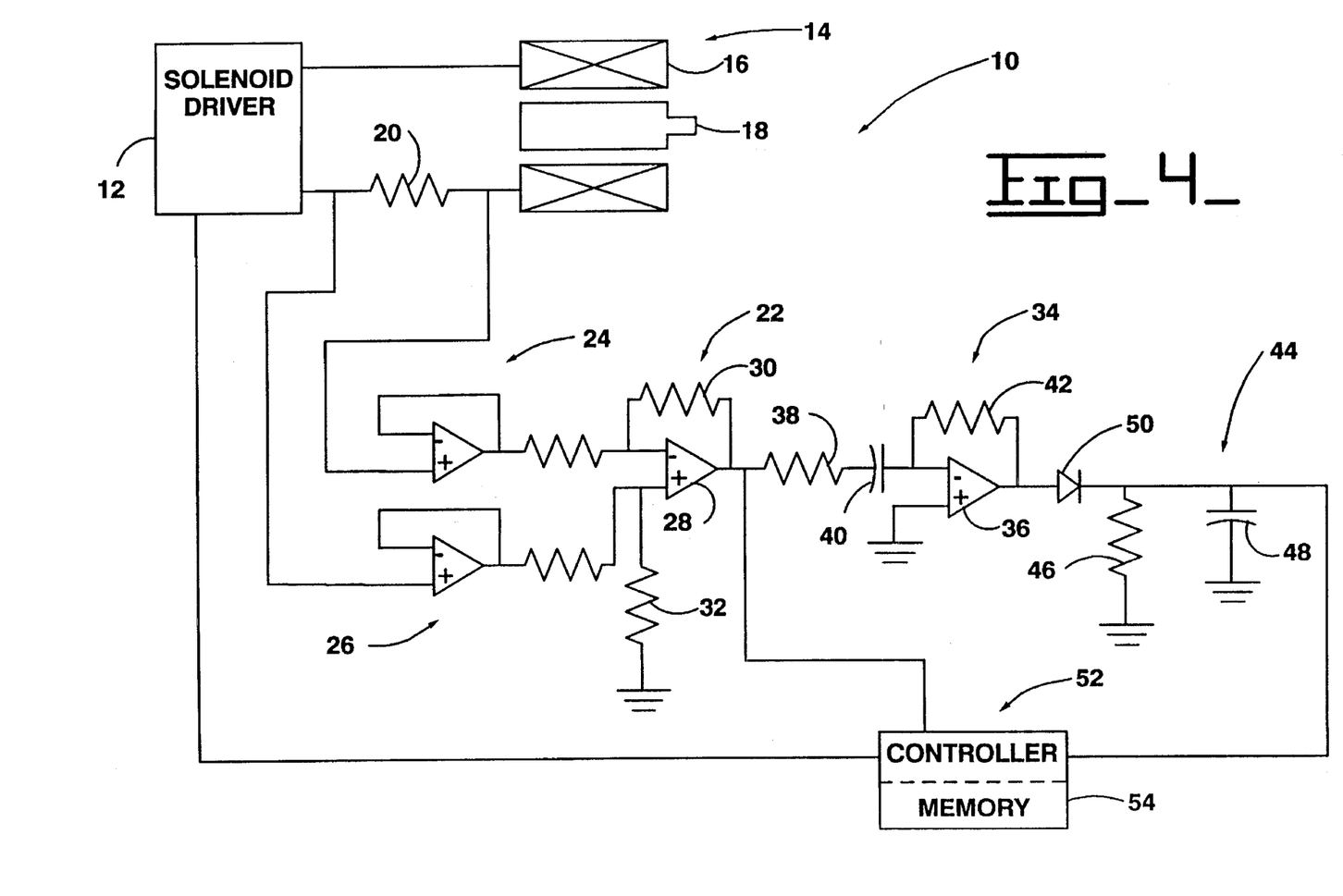
FIG. 4 is a schematic representation of an embodiment of the present invention.

Referring now to FIG. 4, an armature position sensing circuit 10 which determines the position of the armature in response to di/dt and coil current magnitude is shown. More particularly, the peak di/dt signal is detected along with the average value of the current traveling through the coil to determine the position of the armature. As shown, opposing ends of the shunt resistor 20 are preferably connected to a differential amplifier 22 via buffers 24,26. The differential amplifier 22 produces a signal that is indicative of the coil current magnitude and is of a type well-known in the art. The differential amplifier 22 comprises a first operational amplifier 28, a resistor 30 connected between the output and inverting input of the first operational amplifier 28, and a resistor 32 connected between the non-inverting input of the first operational amplifier 28 and circuit ground.

The output of the differential amplifier 22 is connected to a controller 52 and a differentiator 34. The differentiator 34 includes a second operational amplifier 36 and a resistor 38 and a capacitor 40 connected in series between the output of the first operational amplifier 28 and the inverting input of the second operational amplifier 36. A resistor 42 is also connected between the inverting input and the output of the second operational amplifier 36. The non-inverting input of the second operational amplifier is connected to circuit ground.

The output of the second operational amplifier 36 is connected to a peak detection circuit 44 that includes an RC circuit having a resistor 46 and a capacitor 48 connected in parallel between the circuit ground and the cathode of a diode 50. The cathode of the diode is also connected to the controller 52. The anode of the diode 50 is connected to the output of the second operational amplifier 36. The component values associated with the resistor 46 and capacitor 48 are chosen to provide a time constant for the RC circuit that allows the peak value to remain steady enough to provide a useful signal to the controller 52 but yet will allow the output signal to change rapidly enough that the control system 10 accurately indicates the position of the armature as it moves.

The controller 52 includes a memory circuit 54 which has empirically determined data relating to the above-described di/dt, coil current magnitude, and armature position characteristics. The controller 52 receives a signal that is indicative of the coil current magnitude from the differential amplifier 22 and a signal that is indicative of the peak value of the rate of change of the coil current from the peak detection circuit 44. The controller 52 retrieves the stored characteristics from the memory 54 and compares these characteristics to the current magnitude and rate of change signals to determine the position of the armature 18 with respect to the coil 16. In the preferred embodiment, a two-dimensional look-up table of a type well-known in the art is used to complete the comparison and select the proper armature position value. The number of characteristics stored in memory is dependent upon the desired precision of the system. Interpolation may be used to determine the actual position of the armature in the event that the measured and calculated values fall between the discrete values stored in memory.

The controller 52 can then use this information in a diagnostic function to determine whether the solenoid 14 is operating properly, in a closed-loop control to vary the duty cycle of the PWM driving signal in response to the desired and actual positions of the armature, or in a hydraulic clutch control to indicate an end-of-fill condition. It is to be noted that the present invention is not limited to these applications and it may be evident to those skilled in the art that other uses may be possible.

The circuit shown in FIG. 4 is exemplary, and the manner of design and construction of this, or a similar, circuit would be commonly known to a person skilled in the art.

Figure 5A:
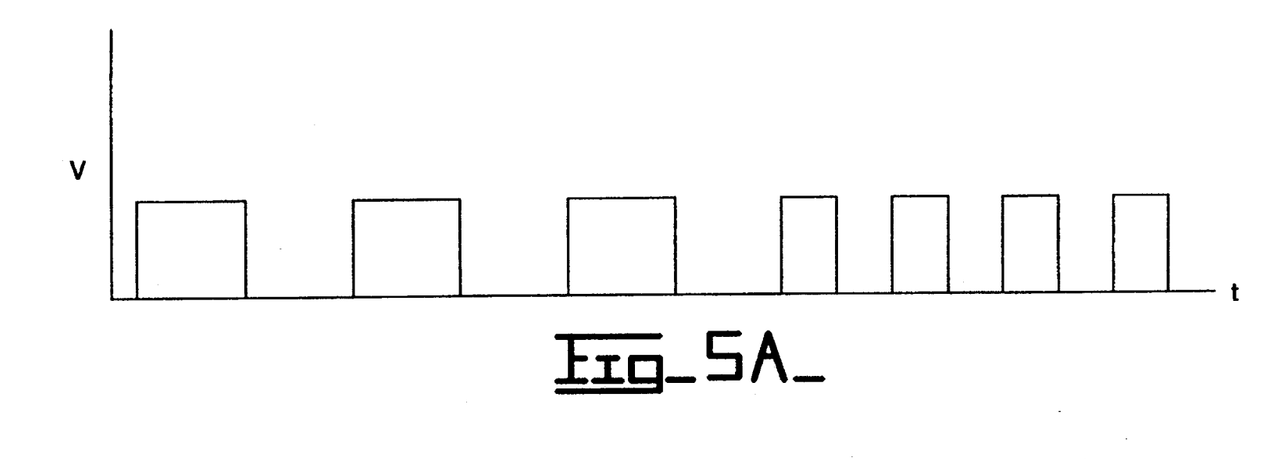
FIG. 5 is a graphical representation of the relationship between the applied voltage, coil current, and inductance.
Figure 5B:
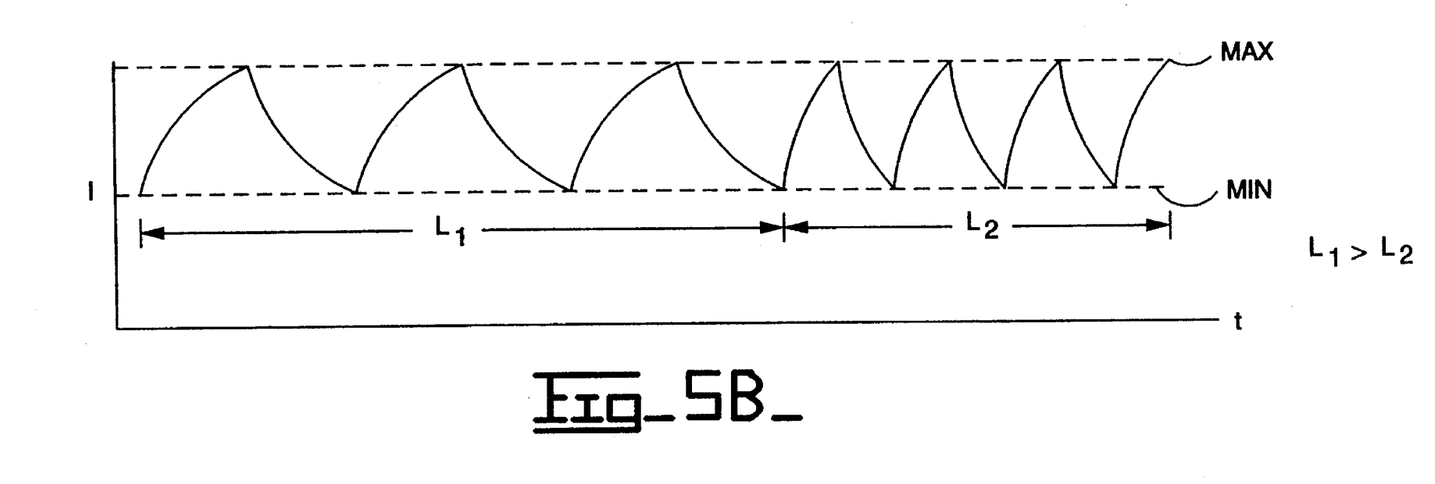

Yet another method for determining the armature position is provided by measuring the frequency of the applied voltage. To further illustrate this, the relationships between the voltage of the driving signal across the terminals of the coil, the magnitude of the coil current with respect to time, and the inductance of the coil are shown in FIG. 5. As voltage is applied to the coil, the magnitude of current in the coil exponentially increases towards a predetermined maximum value (MAX); similarly, as voltage is removed from the coil, the magnitude of current in the coil exponentially decreases to a predetermined minimum value (MIN). As is well known, changes in inductance brings about changes in the rate of growth or decay of the current. Shown on the time graph, the inductance changes from a larger value, $L_1$, to a smaller value, $L_2$. Accordingly, the rate of change of the coil current changes with the changing inductance.

This particular method requires that the coil current is controlled by a "on-off" or "bang-bang" type solenoid driver which utilizes current feedback. This type of solenoid driver operates with a predetermined switching hysteresis to achieve a constant current "ripple" magnitude. The "ripple" magnitude defines the predetermined minimum and maximum current values. The driver generates the driving signal by applying the voltage to the coil either full "on" or full "off" in accordance with the switching hysteresis. More particularly, a desired current value is compared to a measured current value and an error signal is generated which represents the difference of the two values. The switching hysteresis controls the voltage applied to the coil thereby reducing the error signal to zero. Thus, the average coil current value is controlled to the desired current value. This method of current control is well known in the art and will not be further discussed.

From the above discussion it follows that as the inductance of the coil increases, the frequency of the driving signal decreases in order to control the coil current to the desired value. Similarly, as the inductance of the coil decreases, the frequency of the driving signal increases to control the coil current to the desired value.

Since di/dt is a function of armature position and coil current magnitude, the frequency through which the coil current magnitude varies is also a function of coil current magnitude and armature position. Correspondingly, the frequency of the driving signal or applied voltage is a function of coil current magnitude and armature position. By measuring the frequency of the coil current or the frequency of the driving signal, the size of the range through which the inductance varies is indicated. Thus, a signal representing the coil current frequency or driving current frequency can be stored in memory and compared with the stored coil current magnitudes and armature positions to obtain an indication of armature position, in a manner described above.

Figure 6:
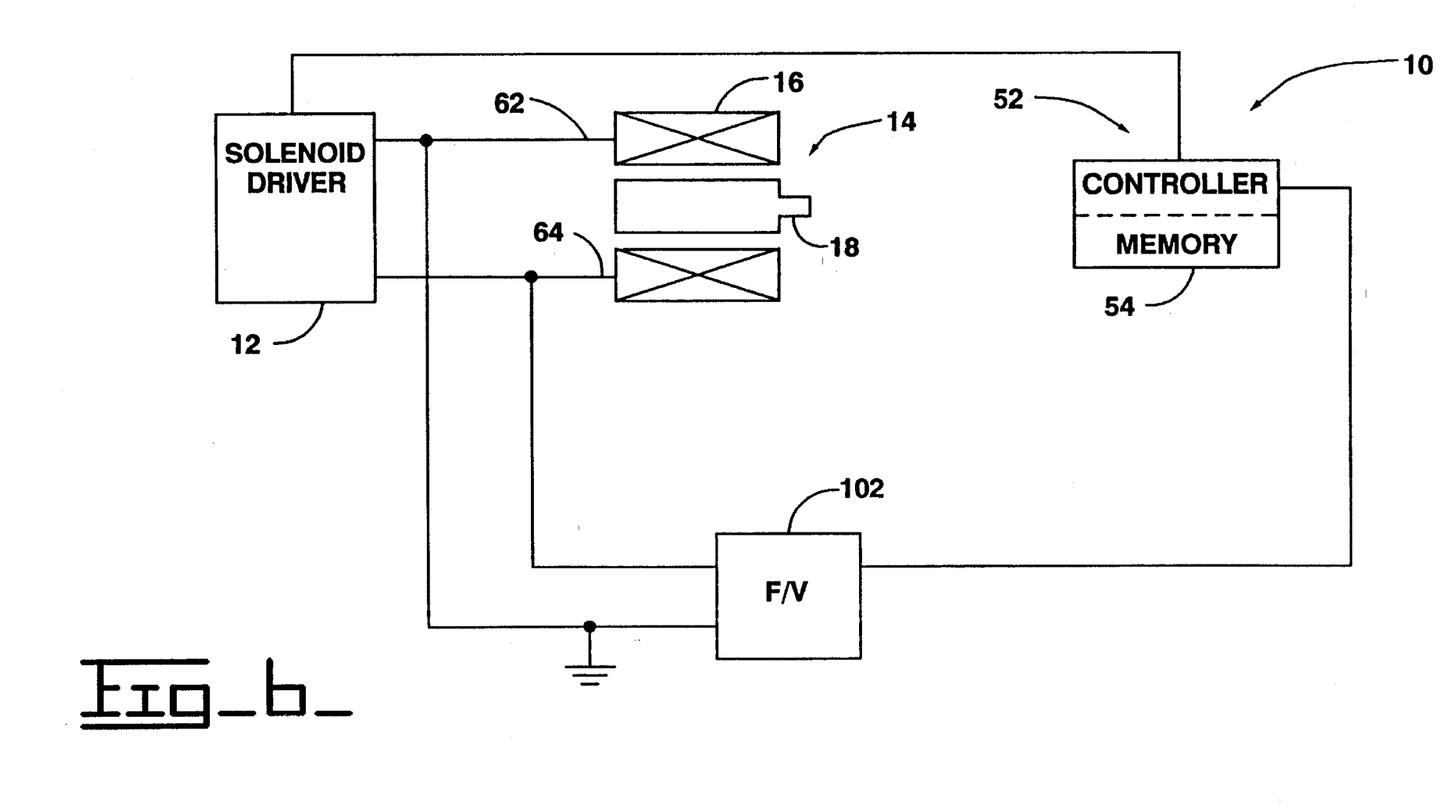
FIG. 6 is a schematic representation of an embodiment of the present invention.

Referring now to FIG. 6, an armature position sensing circuit 10 which determines the position of the armature in response to the frequency of the driving signal and the magnitude of the coil current is shown. However, rather than directly measure the coil current, the value representing the desired current may be utilized instead since the average coil current is controlled substantially at the desired current value. As discussed above, the solenoid driver 12 is an "on-off" voltage driver having current feedback control. As shown, a frequency to voltage (F/V) converter 102 is connected between the solenoid driver 12 and the solenoid 14. The F/V converter 103 is adapted to measure the frequency of the driving signal and convert the frequency value to a voltage value in a well known manner. In the preferred embodiment, the F/V converter 102 is a circuit manufactured by National Semiconductor as part no. LM 2917. The output of the F/V converter 102 is connected to the controller 52.

The controller 52 includes a memory circuit 54 which has empirically determined data relating to the above-described driving signal frequency, the desired current value, and armature position characteristics. The controller 52 receives a voltage signal representing the driving signal frequency and a signal representing the desired current value. The controller 52 retrieves the stored characteristics from the memory 54 and compares these characteristics to the representative signals to determine the position of the armature 18 with respect to the coil 16. In the preferred embodiment, a two-dimensional look-up table of a type well-known in the art is used to complete the comparison and select the proper armature position value. The number of characteristics stored in memory is dependent upon the desired precision of the system. Interpolation may be used to determine the actual position of the armature in the event that the measured and calculated values fall between the discrete values stored in memory.

The controller 52 can then use this information in a diagnostic function to determine whether the solenoid 14 is operating properly, in a closed-loop control to control the driving signal in response to the desired and actual positions of the armature, or in a hydraulic clutch control to indicate an end-of-fill condition.

Figure 7A:
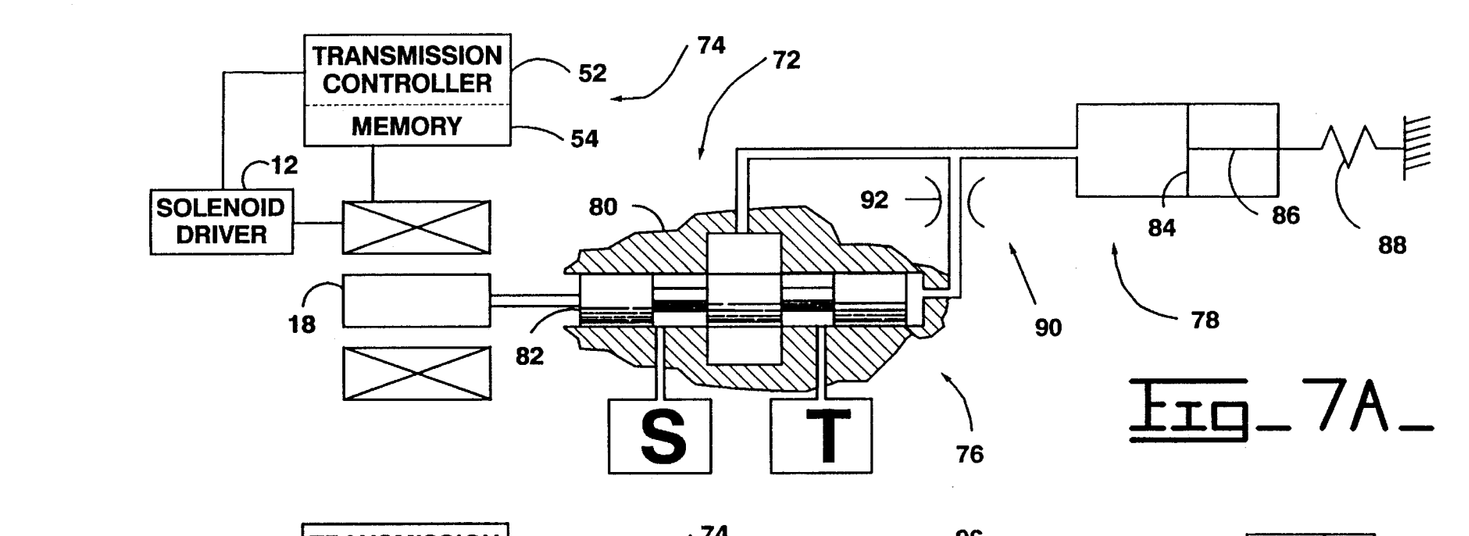
FIG. 7A is a diagrammatic view of an electrohydraulic valve operated clutch piston including an embodiment of the present invention.

Referring primarily to FIG. 7, an embodiment of the instant invention capable of indicating an end-of-fill condition in a hydraulically operated clutch is shown. In this embodiment, the solenoid 14 forms a portion of an electro-hydraulic valve 72 and the controller 52 takes the form of an end-of-fill detector. The end-of-fill detector is disposed within a transmission controller 74 that is adapted to controllably engage and disengage the clutches of a vehicle's transmission. The transmission controller receives signals indicative of certain parameters of the vehicle (for example, engine speed, accelerator pedal position, and ground speed) and generates signals to engage/disengage the clutches in accordance with a set of shifting rules. Typically, such controllers include a microcontroller or microcomputer. Many variations of such transmission controllers are well known in the art and are therefore not discussed further.

In the preferred embodiment, the signal from the transmission controller 74, is a current applied to the coil 16 of the electrical solenoid 14. A valve means 76 delivers hydraulic fluid from a source of pressurized fluid to a clutch 78 in response to the current applied to the coil 16.

As hydraulic fluid is delivered to the clutch 78, the clutch or control volume increases to a maximum or near maximum level. Since hydraulic fluid is still being delivered to the clutch 78, the clutch pressure rises rapidly.

In the preferred embodiment, the valve means 76 includes a spool (control) valve 80. The spool valve 80 is connected between the clutch 78 and a source of pressurized fluid S, and includes a spool 82. The spool 82 is connected to the armature 18 of the solenoid 14. When no current is being applied to the solenoid 14, the spool valve 80 is said to be in a no-flow position. That is, there is no fluid flow between S and the clutch volume, C. When maximum fluid flow is allowed between S and C, the spool valve is said to be in a full flow position. A tank of hydraulic fluid T, is also provided to allow the clutch 78 to drain. The pressurized hydraulic fluid is created by a pump arrangement (not shown). Many such arrangements are known in the art, and are therefore not further discussed.

A clutch volume, C, is defined by the walls of the clutch 78 and a piston 84. The clutch 78 includes a number of clutch plates (not shown). When the clutch volume, C, is pressurized to its end-of-fill pressure, the clutch plates are pinned together and the clutch 78 is said to be engaged. For the purpose of illustration, the clutch plates are modeled by a rod 86 and a spring 88. The spring 88 acts to bias the piston 84 to the left, thereby acting to decrease the clutch volume and to disengage the clutch 78.

Feedback means 90 provides a restricted flow of fluid from the clutch volume, C back to the valve means 76. In the preferred embodiment, the feedback means 90 includes a restrictive orifice 92.

With reference to FIGS. 8A–8D, graphical representations of the coil current and voltage, spool position, control pressure, and clutch position are shown for the purpose of illustrating the operation of the end-of-fill detector during a typical fill operation.

At time, $t_0$, the clutch 102 is disengaged, coil current and voltage are zero (0), there is no flow of hydraulic fluid to the clutch, the spool is at its minimum position, and the piston is at its minimum position. Before $t_0$, the clutch 102 is said to be fully disengaged.

Figure 8A:
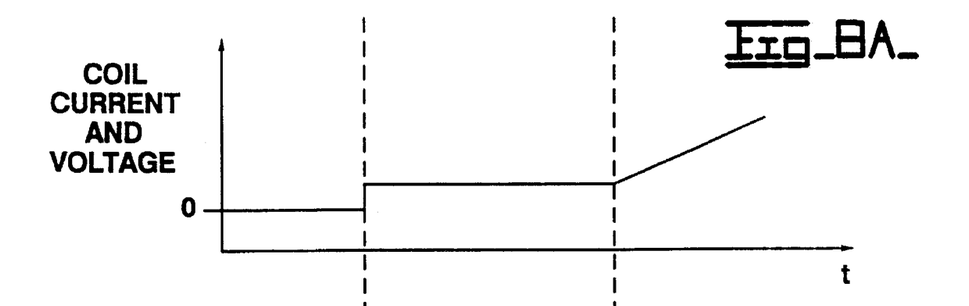
FIG. 8A is an exemplary graph illustrating coil current and voltage during clutch actuation.

Prior to time $t_1$, the controller 74 signals the solenoid 14 to actuate the valve means 76 and to fill (engage) the clutch 78. In the preferred embodiment, the controller 74 includes a pulse width modulated (PWM) solenoid driver for controlling the current supplied to the coil 16.

At $t_1$, the solenoid driver circuit 12 delivers a first current level to the coil 16, as shown in FIG. 8A. The current within the coil 14 creates a magnetic force within the solenoid 16 which moves the armature 18 with respect to the coil 16. To begin filling the clutch volume, the first current level from the solenoid driver acts to move the armature 18 and therefore the spool 82, from the minimum or original position towards a maximum position, see FIG. 8B.

Figure 8B:
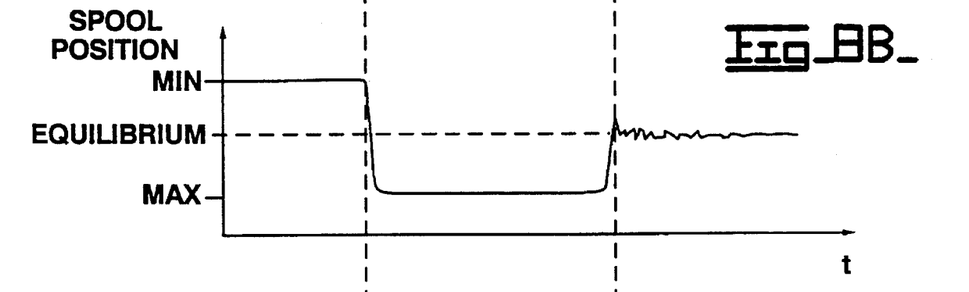
FIG. 8B is an exemplary graph illustrating spool position during clutch actuation.
Figure 8C:
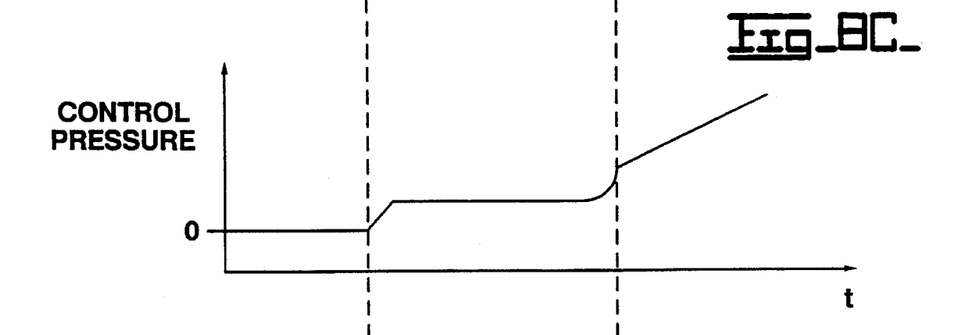
FIG. 8C is an exemplary graph illustrating control pressure during clutch actuation.
Figure 8D:
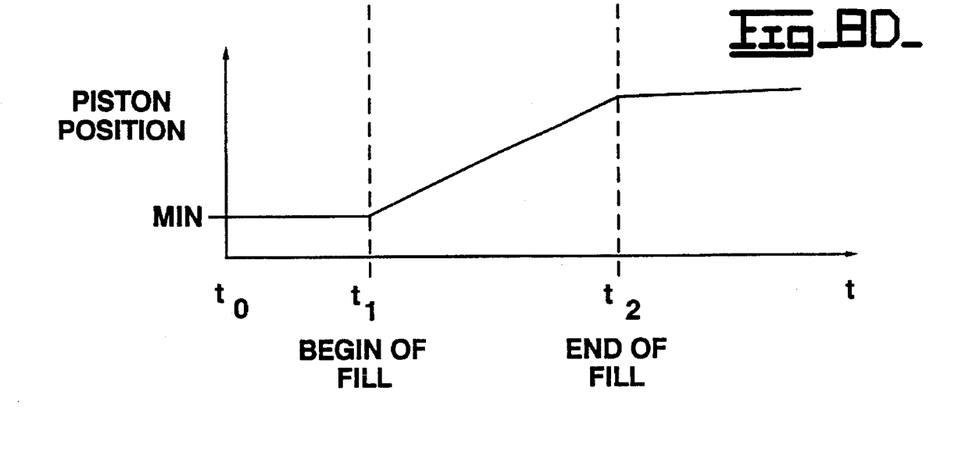
FIG. 8D is an exemplary graph illustrating clutch position during clutch actuation.

As shown in FIG. 8D, the flow of hydraulic fluid into the clutch volume acts against the piston 84 and the spring 88, moving the piston 84 (also to the right), and thereby, increasing the clutch volume.

As the piston 84 moves to the right, the clutch plates begin to compress. At time $t_2$, the piston is near its maximum position, the clutch plates are nearly locked, the pressure within the clutch volume increases sharply due to the increased resistance from the clutch plates and the continued flow of hydraulic fluid from S. The increase in pressure exerts force on the spool 82 via the feedback means 90. This pressure flux creates a transient reverse pressure differential across the spool valve 80 which causes the spool 82 to move to an equilibrium position as shown in FIG. 8B.

The movement of the spool 82 from the maximum position to the equilibrium position is sensed by the transmission controller 74 which responsively produces an end-of-fill signal that causes the solenoid driver circuit 12 to increase the coil current. As illustrated in FIGS. 8A and 8C, the increase in coil current increases the magnitude of the magnetic force acting on the armature which responsively increases the pressure of fluid in the clutch 78 to engage the clutch plates.

Figure 7B:
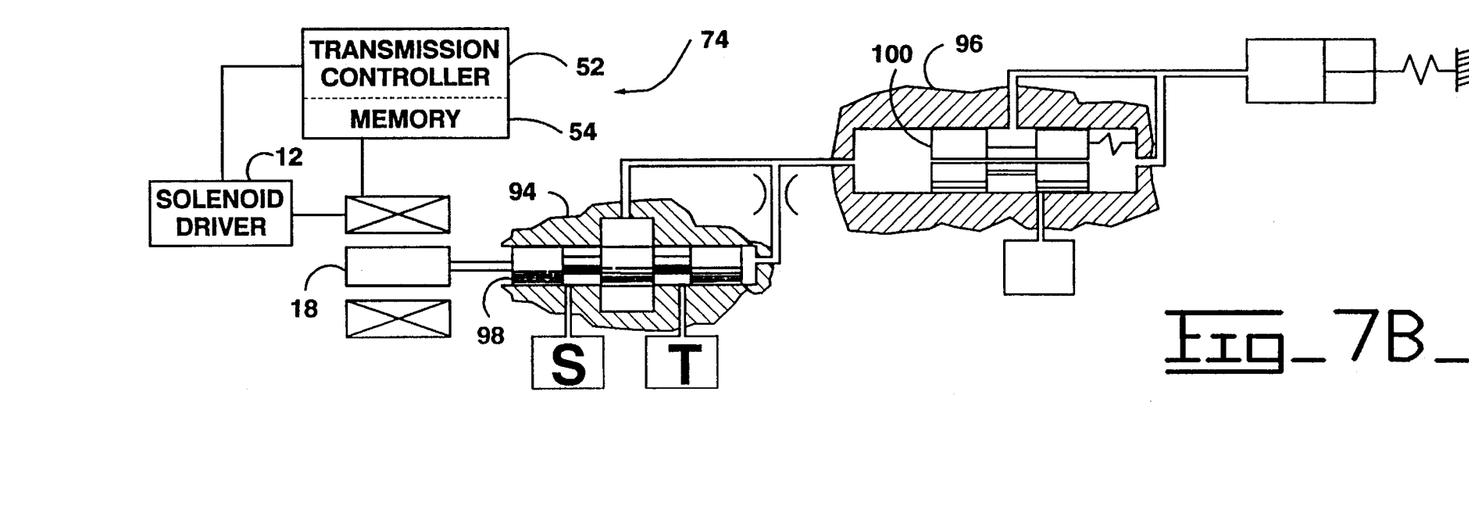
FIG. 7B is a diagrammatic view of a clutch piston controlled by a dual stage spool valve design including an embodiment of the present invention.

For large clutches, a multistage design may be needed to gain the benefits of higher fluid flow. With reference to FIG. 7B, a dual stage spool valve design includes a first spool or pilot valve 94 and a second spool or control valve 96. The solenoid 14 is connected to the first spool 98 of the first spool valve 94. The first spool 98 is movable in response to energization of the coil 16 and allows fluid to flow from S to the first control volume, $C_1$. The first spool valve 94 controls the flow of fluid to a second control volume, $C_2$ (the clutch volume). The control valve 96 has a second spool 100. The second spool 100 allows fluid to flow from the first control volume, $C_1$ to the second control volume, $C_2$ through a conduit in the second spool 100. The second spool 100 is spring biased to close the path between the source, S and the clutch volume. The first spool valve 94 creates a pressure differential across the second spool valve 96. When the pressure differential becomes large enough to overcome the biasing force, the spool moves and fluid is allowed to pass directly from S to the clutch through the second spool valve 96.

There are many variations of such multistage designs with parameters suited to different applications. For example, different feedback schemes and spool designs will give the system different operating characteristics. Since the specific design of the valve means 76 is application specific and has no bearing on the present invention, no further discussion is given.

Industrial Applicability

With reference to the drawings and in operation, the present invention is adapted to indicate the position of an armature with respect to the coil of an electromagnetic actuator and to signal a transmission controller 74 at the occurrence of an end of fill condition of a hydraulic clutch 78. The following description is only for the purposes of illustration and is not intended to limit the present invention as such. It will be recognizable, by those skilled in the art, that the present invention is suitable for a plurality of other applications.

The actuator control system 10 determines the magnitude and the rate of change of current flowing in the coil 16 of a solenoid 14 and compares this data to empirically determined data relating magnitude and rate of change of coil current to the position of the armature 18 with respect to the coil 16. This comparison is preferably performed by a simple two-dimensional look-up scheme of a type well known in the art and includes the ability to interpolate between the discrete values that are stored in memory.

In one embodiment, the stored data directly relates the magnitude and rate of change of coil current to the position of the armature 18. In an alternative embodiment, the derivative of the flux linkage with respect to the current in the coil 16 is determined from the rate of change of coil current and the magnitude of the current and voltage in the coil 16. In this embodiment, the stored data relates the derivative of flux linkage, the magnitude of coil current, and armature position.

The position of the armature that is determined by the controller 52 is then usable in connection with a number of control and diagnostic systems. For example, the position information can be used to provide a closed-loop control system for a solenoid by providing the controller with an actual position that can be compared with a desired position in order to responsively change the magnitude of current in the coil accordingly. Alternatively, the position information can be used in a diagnostic system to determine whether the armature or the device being actuated by the armature is operating properly in response to the desired function being indicated by the control system.

In particular, the position information can be used in connection with a transmission controller 74 which controls the shifting of a transmission on a vehicle (not shown) between a plurality of gear ratios. For example, the transmission may include three forward and three reverse gear ratios.

The transmission controller 74 operates a plurality of electrical solenoids. The solenoids are adapted to engage/disengage the transmission's hydraulic clutches, such that the transmission is shifted to the desired gear ratio.

The transmission controller 74 receives information related to the desired operation of the vehicle and to the vehicle's operating environment and energizes/deenergizes the solenoids. For example, the controller 74 may receive information related to a desired or maximum gear ratio, the position of the accelerator pedal (not shown), and/or the actual speed of the vehicle.

Based on the received information, the transmission controller 74, operates the hydraulic clutches through actuation of the solenoids in accordance with a set of programmed shift rules. For example, in response to the received information, the transmission controller 74 requires an upshift to the third forward gear ratio. To implement this requirement, one or more clutches need to be disengaged and one or more additional clutches engaged. The exact clutch(es) to be engaged/disengaged are dependent upon the structure of the transmission.

The transmission controller 74, begins to fill the required clutches 78 as discussed above. When a clutch 78 reaches the end of fill condition, the resulting movement of the spool 82 is sensed by 10 the transmission controller 74 which responsively produces an end-of-fill signal to cause the solenoid driver circuit 12 to modulate the coil current to engage the clutch 78.

Other aspects, objects, and advantages of this invention can be obtained from a study of the drawings, the disclosure, and the appended claims.

I claim:

1. An apparatus for determining the position of an armature of an electromagnetic actuator having a coil, the armature being movable to and between first and second positions in response to current flowing through the coil, comprising:

means for applying a voltage to said coil to cause current to flow through said coil at a desired current magnitude;

means for measuring the frequency of said applied voltage; and means for determining the position of the armature with respect to the coil in response to the applied voltage frequency and desired current magnitude.

2. An apparatus, as set forth in claim 1, wherein said position determining means includes a memory means for storing a plurality of positions corresponding to a plurality of applied voltage frequencies and desired current magnitudes, and responsively selecting one of said plurality of stored positions.

3. An apparatus for determining the position of an armature of an electromagnetic actuator having a coil, the armature being movable to and between first and second positions in response to current flowing through the coil, comprising:

means for applying a driving signal to said coil;

means for measuring the frequency of said driving signal and producing a voltage signal; means for measuring the magnitude of current in the coil and producing a magnitude signal; and means for receiving said magnitude and voltage signals, and responsively determining the position of the armature with respect to the coil.

4. An apparatus, as set forth in claim 3, wherein said position determining means includes a memory means for storing a plurality of positions corresponding to a plurality of magnitudes associated with the voltage and magnitude signals, and responsively selecting one of said plurality of stored positions.

5. A method for determining the position of an armature of an electromagnetic actuator having a coil, the armature being movable to and between first and second positions in response to current flowing in the coil, comprising the steps of:

applying a voltage to said coil to cause current to flow through said coil at a desired current magnitude;

measuring the frequency of said applied voltage; and determining the position of the armature with respect to the coil in response to applied voltage frequency and desired current magnitude.

6. A method, as set forth in claim 5, including the steps of storing a plurality of positions corresponding to a plurality of applied voltage frequency and desired current magnitudes, and responsively selecting one of said plurality of stored positions.

* * * * *